(12) United States Patent
Okamura

(10) Patent No.: US 6,353,266 B1
(45) Date of Patent: Mar. 5, 2002

(54) SEMICONDUCTOR DEVICE HAVING IMPROVED PAD COUPLED TO WIRING ON SEMICONDUCTOR SUBSTRATE

(75) Inventor: Ryuichi Okamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/572,325

(22) Filed: May 18, 2000

(30) Foreign Application Priority Data

May 19, 1999 (JP) ............................................. 11-139245

(51) Int. Cl.[7] .......................... H01L 23/48; H01L 23/52; H01L 29/40
(52) U.S. Cl. ...................... 257/786; 257/784; 257/700; 257/701; 257/758; 257/778; 257/774; 257/680; 257/698; 257/737; 257/738
(58) Field of Search ................................. 257/778, 784, 257/786, 774, 680, 700, 758, 701, 698, 730, 737, 738

(56) References Cited

U.S. PATENT DOCUMENTS

| | | | |
|---|---|---|---|
| 5,903,058 A | * 5/1999 | Akam | 257/778 |
| 5,911,109 A | * 6/1999 | Razouk et al. | 438/424 |
| 5,965,943 A | * 10/1999 | Mizuta | 257/763 |
| 6,042,953 A | * 3/2000 | Yamaguchi et al. | 428/652 |
| 6,051,489 A | * 4/2000 | Young et al. | 257/737 |
| 6,072,242 A | * 6/2000 | Son | 257/774 |
| 6,084,304 A | * 7/2000 | Huang et al. | 257/762 |
| 6,157,078 A | * 12/2000 | Lansford | 257/734 |
| 6,157,079 A | * 12/2000 | Taguchi | 257/737 |
| 6,188,134 B1 | * 2/2001 | Stumburg et al. | 257/751 |
| 6,198,170 B1 | * 2/2001 | Zhao | 257/784 |

FOREIGN PATENT DOCUMENTS

JP          9-270426          10/1997

* cited by examiner

Primary Examiner—Alexander O. Williams
(74) Attorney, Agent, or Firm—Young & Thompson

(57) ABSTRACT

A semiconductor device includes a semiconductor substrate, a wiring formed on the semiconductor substrate, a cover film formed on the semiconductor substrate and the wiring. The cover film has a through hole to expose the wiring. A pad is formed in the through hole to electrically connect to the wiring without being formed on a top surface of the cover film.

14 Claims, 3 Drawing Sheets

SEMICONDUCTOR DEVICE HAVING IMPROVED PAD COUPLED TO WIRING ON SEMICONDUCTOR SUBSTRATE

BACKGROUND OF THE INVENTION

1. Field of the Invention

The present invention relates to a semiconductor device, and more particular to a flip-chip package.

2. Description of the Related Art

FIG. 4 is a sectional view of a flip-chip type semiconductor device for describing a first related art. Referring to FIG. 4, the device has a top layer wiring 46 on a semiconductor substrate 48, a cover layer 44 having a through hole 45 for exposing the top layer wiring 46, and a copper pad 42 to electrically connect with the wiring 46 via the through hole 45. As an example of the first prior art, there may be mentioned a technology disclosed in Japanese Patent Application Laid Open Hei 9-270426.

FIG. 5 is a sectional view of a flip-chip type semiconductor device for describing a second related art. Referring to FIG. 5, the device has a top layer wiring 56 on a semiconductor substrate 58, a cover film 54 having a through hole 55 formed on the top layer wiring 56 and the semiconductor substrate 58, a copper pad 52 to electrically connect with the wiring 56 via the through hole 55, a second cover film 51 formed on the pad 52, and a second opening 53 formed in the portion of the second cover film 51 above the top layer wiring 52.

However, since the wirings 45, 55 of the device according to the first and second prior arts are formed on the films 44, 54, respectively, a large area for the wiring is needed on the cover film. Therefore, it becomes difficult to form wirings without connecting from each other when the device is made smaller. FIG. 4 also has a problem in that it necessitates the process of forming the through hole 45. Moreover, the films 44 (45) has the through hole 45 (55) by a carved wall to position a solder ball (not shown) on a center of the wiring 44. However, it is difficult to form such a carved wall. Additionally, since the wiring 45 is made with a thin thickness enough to keep the carve of the carved wall and is patterned as shown in FIGS. 4 and 5, it needs complex technique to keep such demands.

SUMMARY OF THE INVENTION

It is an object of the present invention to provide a semiconductor device with high reliability and high yield that avoids the misalignment between the pad and a solder ball and reduces the area for the pad.

A semiconductor device of the present invention includes a semiconductor substrate, a wiring formed on the semiconductor substrate, a cover film formed on the semiconductor substrate and the wiring, the cover film has a through hole to expose the wiring, and a pad formed in the through hole to electrically connect to the wiring without being formed on a top surface of the cover film.

A method of manufacturing a semiconductor of the present invention includes:

forming a first insulating film on a first wiring, the first insulating film having a through hole to expose the first wiring;

forming a conductive layer on the film; and etching the conductive layer until a top surface of the film is exposed to form a pad in the through hole.

Preferably, the conductive layer is etched by a chemical mechanical polishing process.

BRIEF DESCRIPTION OF THE DRAWINGS

The above and other objects, features and advantages of the present invention will be more apparent from the following description taken in conjunction with the accompanying drawings, in which.

DESCRIPTION OF THE PREFERRED EMBODIMENTS

Figure 1:
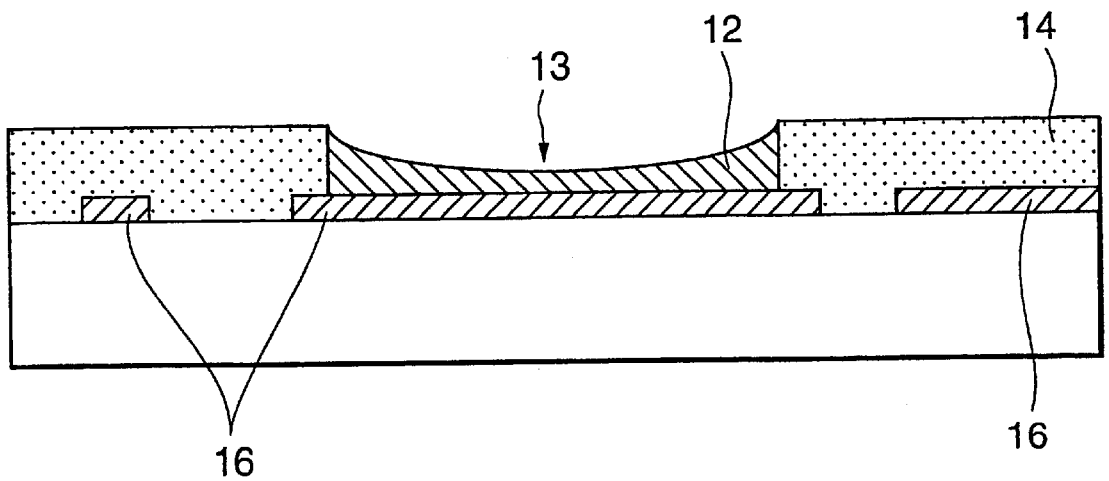
FIG. 1 is a sectional view of an element for describing a semiconductor device according to a first embodiment of the invention.

FIG. 1 is a sectional view of a semiconductor device according to a first embodiment of this invention. In FIG. 1, the device of a flip-chip type comprises a semiconductor substrate 18, a top layer wiring 16 formed on the substrate 18, a cover film 14. The cover film 14 has an opening 13 to expose a portion of the wiring 16. A pad 12 is only formed in the opening directly on the wiring 16. The pad 12 is not formed on the cover film 14. A solder ball (not shown) is thereafter formed on the pad 12. The cover film 14 protects the surface of the device from a shock, particles or metallic impurities, and minute pollutants such as organic substances. The top layer wiring 16 establishes electrical connections between electronic components (not shown) such as semiconductor element on or in the semiconductor substrate 18. The cover film 14 is formed by an insulating film, for example.

Next, a manufacturing method of the device of the present invention will be described. At first, the top layer wiring 16 of copper is formed on the semiconductor substrate 18. Then, the cover film 14 is formed on the wiring 16. Then, an opening 13 is formed in the cover film 16 at a portion to be the pad 12. Then, the opening 13 is filled with copper and unwanted copper on the cover film 14 is removed by CMP to thereby form the pad 12 in the opening 13 of the covering film 14.

According to the first embodiment as described above, the following effects can be realized.

A first effect is that the area for the pad 12 can reduce. The reason for this is that the pad 13 is formed directly on the top layer wiring 16 in the opening 13 without being on the cover film 14.

A second effect is that there is no misalignment between the pad 12 and the solder ball that enhances he reliability and the wield. The reason for this is that the central part of the pad 12 is formed concavely like a recess through the dishing by CMP (Chemical Mechanical Polishing) so that the solder ball is arranged at the central part of the pad 12 in self-aligned manner at solder ball mounting.

A third effect is that the dishing amount (recessed amount) of the pad 12 due to CMP can easily be controlled, for example, reduced. When the diameter of the pad is about 100 μm, for example, the dishing amount of the pad 12 due to CMP is set in the range of 0.1 to 10 μm, although the dishing amount varies depending upon the pad diameter and the conditions of CMP.

Figure 2:
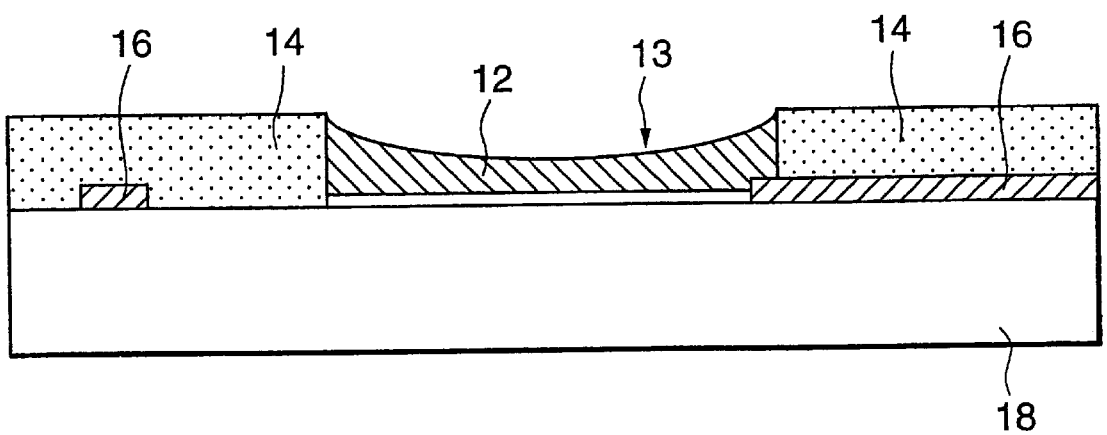
FIG. 2 is a sectional view of an element for describing a semiconductor device according to a second embodiment of the invention.

FIG. 2 is a sectional view of a flip chip type device according to a second embodiment of this invention. In FIG. 2, the device has a pad 12, an opening 13, a cover film 14, a top layer wiring 16, and a semiconductor substrate 13. Components identical to those already described in connection with the first embodiment are given identical symbols, and repeated description is omitted. In the first embodiment, the top layer wiring 16 is formed on the entire surface beneath the pad 12. In contrast, this embodiment is characterized in that only the connection part of the pad 12 and the top layer wiring 16 is overlapped. In this way, the effects the same as those described in connection with the first embodiment are obtainable.

Figure 3:
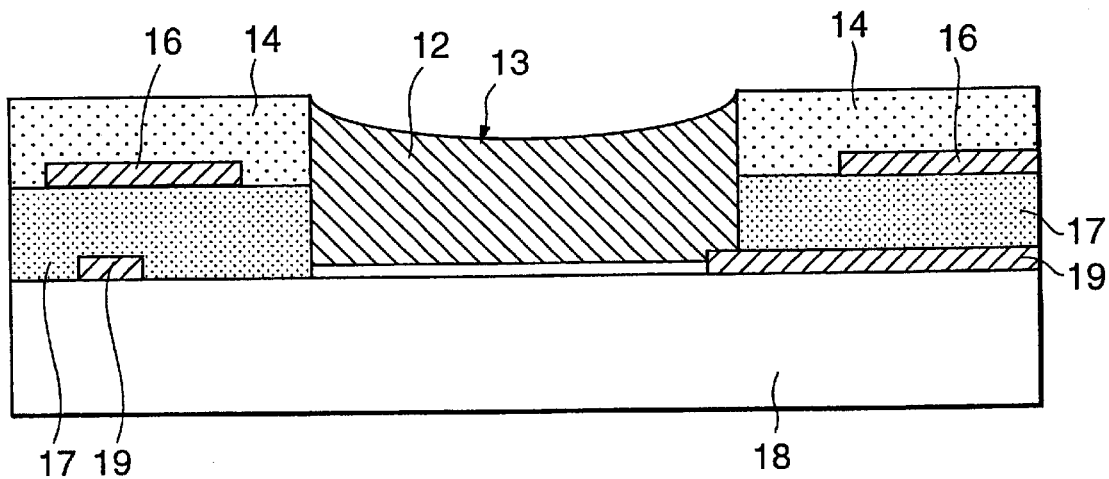
FIG. 3 is a sectional view of an element for describing a semiconductor device according to a third embodiment of the invention.
Figure 4:
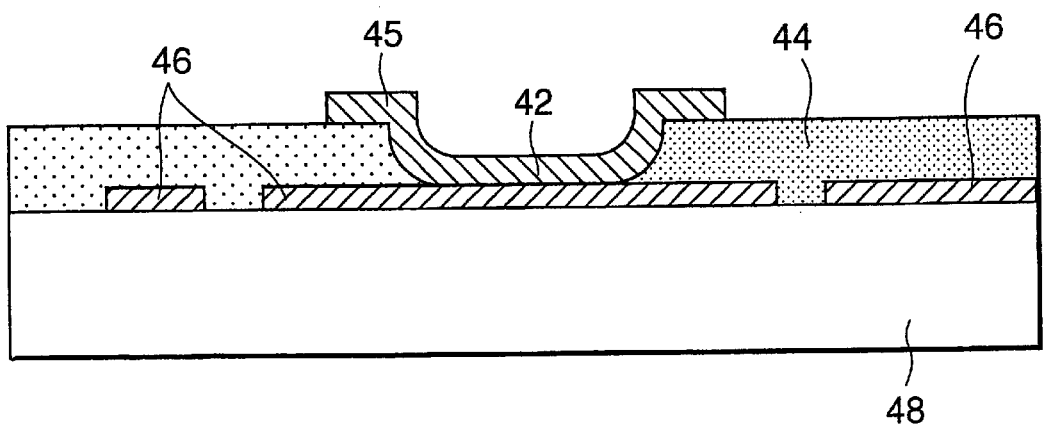
FIG. 4 is a sectional view of a device for describing a first related art.
Figure 5:
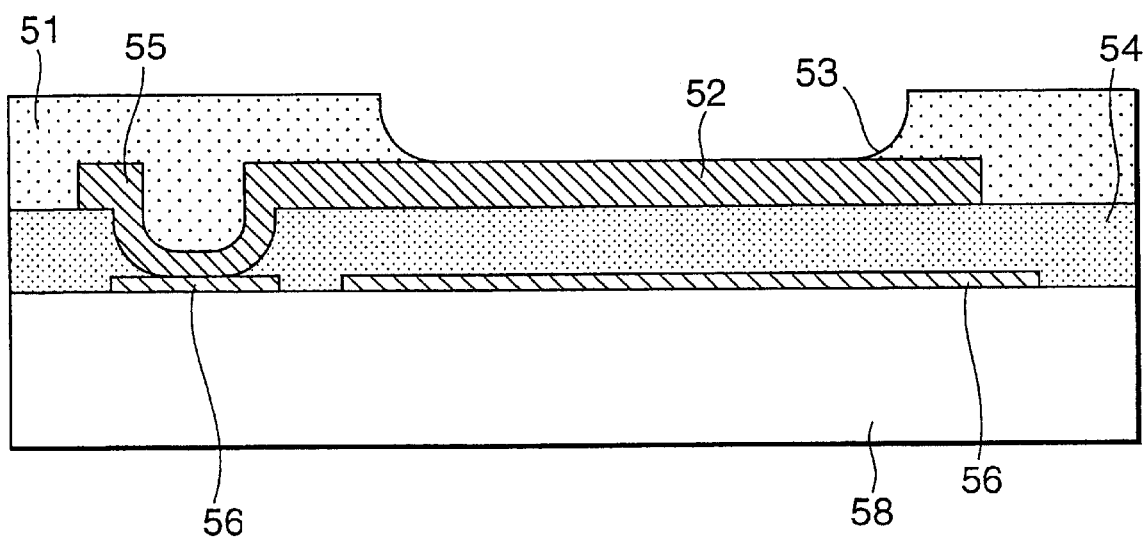
FIG. 5 is a sectional view of a device for describing a second related art.

FIG. 3 is a sectional view of a semiconductor device according to a third embodiment of this invention. In FIG. 3, the device includes a pad 12, an opening 13, a cover film 14, for example, formed by an insulating film, a top layer wiring 16, an interlayer film 17, for example, formed by an insulating film, a semiconductor substrate 18, and a lower layer wiring 19. Components identical to those that are already described in connection with the first or the second embodiment are given identical symbols, and repeated description is omitted.

Referring to FIG. 3, this embodiment is characterized in that it has a structure in which the lower layer wiring 19 and the pad 12 are connected directly. In this case, the lower layer wiring 19 may be formed on the entire surface beneath the pad 12 as in the first embodiment. Moreover, since the lower layer wiring 19 acts as an etching stopper when an etching is carried out till the wiring 19 is reached, the films 14 and 17 are etched at a potion where the pad 12 is formed simultaneously with the etching of the cover film 14. Furthermore, if the structure is such that the wiring is formed on the entire surface beneath the pad 12, the etching margin is increased so that the etching is facilitated. In this way, in addition to the effects described in connection with the first embodiment, it becomes possible to form several kinds of pads 12 having different wiring layers to be connected, such as the pad 13 to be connected to the top layer wiring 16, a pad 12 to be connected to a wiring layer in which the top layer wiring 16 is formed and to the lower layer wiring 19 insulated by the interlayer film 17, a pad 12 to be connected to a wiring of a still lower wiring layer, and the like, can be formed simultaneously in one etching. Moreover, this invention has an effect of permitting simultaneous connection of a single pad 12 with two or more wirings.

It should be clear that the present invention is not limited to the embodiments described above, and each embodiment can be modified appropriately within the scope of the technical concept of the invention. Moreover, the number, positions, forms, or the like of the constituent components in the invention may be chosen appropriately in view of the application of the invention to a practical situation.

What is claimed is:

1. A semiconductor device comprising:
    a semiconductor substrate;
    a wiring formed on said semiconductor substrate;
    a cover film formed on said semiconductor substrate and said wiring, said cover film having a through hole to expose said wiring; and
    a pad formed in said through hole to electrically connect to said wiring without being formed on a top surface of said cover film,
        wherein said pad comprises a top surface downwardly rounded from a perimeter of said through hole.

2. The device as claimed in claim 1, wherein said pad is directly formed on said wiring.

3. The device as claimed in claim 2, wherein said pad has a smooth concave top surface remaining below an upper surface of said cover film.

4. The device as claimed in claim 3, wherein said wiring is directly connected to the entire surface beneath said pad.

5. The device as claimed in claim 3, wherein said wiring is a top layer wiring formed over said semiconductor substrate.

6. The device as claimed in claim 1, wherein said device has a structure such that said wiring to be connected directly to said pad is a lower layer wiring formed on the semiconductor substrate.

7. A semiconductor device comprising:
    a semiconductor substrate;
    a first wiring formed on said semiconductor substrate;
    an interlayer film formed on said semiconductor substrate and said wiring;
    a second wiring formed on said interlayer film;
    a cover film formed on said second wiring and said interlayer film;
        said interlayer film and said cover film having a through hole therethrough to expose said first wiring and preventing said second wiring from being exposed;
        a pad formed in said through hole, said pad being free of contact with said second wiring.

8. The device as claimed in claim 1, wherein said pad has a mechanical polished top surface.

9. The device as claimed in claim 7, wherein said pad has a downwardly rounded top surface.

10. The device as claimed in claim 9, wherein said pad has a mechanical polished top surface.

11. The device as claimed in claim 9, wherein said pad is not formed on said cover film.

12. The device as claimed in claim 9, wherein said pad is directly connected to said first wiring.

13. The device as claimed in claim 12, wherein an entire lower surface of said pad is directly connected to said first wiring.

14. The device as claimed in claim 13, wherein said pad is a copper pad.

* * * * *